United States Patent
Raschke

(10) Patent No.: US 9,949,362 B2
(45) Date of Patent: Apr. 17, 2018

(54) PROTECTIVE COVER FOR PRINTED CIRCUIT BOARD

(71) Applicant: ZF Friedrichshafen AG, Friedrichshafen (DE)

(72) Inventor: Dirk Raschke, Auerbach (DE)

(73) Assignee: ZF FRIEDRICHSHAFEN AG, Friedrichshafen (DE)

(*) Notice: Subject to any disclaimer, the term of this patent is extended or adjusted under 35 U.S.C. 154(b) by 0 days.

(21) Appl. No.: 15/157,540

(22) Filed: May 18, 2016

(65) Prior Publication Data

US 2016/0374225 A1    Dec. 22, 2016

(30) Foreign Application Priority Data

Jun. 16, 2015    (DE) .................. 10 2015 211 027

(51) Int. Cl.
*H05K 5/00* (2006.01)
*H05K 1/02* (2006.01)

(52) U.S. Cl.
CPC . *H05K 1/0257* (2013.01); *H05K 2201/09172* (2013.01); *H05K 2201/10287* (2013.01); *H05K 2201/10446* (2013.01)

(58) Field of Classification Search
CPC ....... H05K 1/0257; H05K 2201/09172; H05K 2201/10287; H05K 2201/10446; F16H 16/0204

USPC .......... 361/728–730, 752, 748, 760; 439/79, 439/630

See application file for complete search history.

(56) References Cited

U.S. PATENT DOCUMENTS

| | | | | |
|---|---|---|---|---|
| 5,860,832 A * | 1/1999 | Wayt | ................... | H01R 23/661 439/465 |
| 5,928,029 A * | 7/1999 | Lam | ..................... | H01R 12/777 439/495 |
| 7,238,032 B2 * | 7/2007 | Pabst | ..................... | H01R 12/79 439/67 |
| 7,354,299 B2 * | 4/2008 | Yamada | ............... | H01R 9/0512 439/497 |
| 8,002,555 B2 * | 8/2011 | Lee | ..................... | H01R 13/4538 439/49 |
| 9,190,746 B2 * | 11/2015 | Crofoot | ................ | H05K 3/3405 |
| 2014/0193986 A1 * | 7/2014 | Venaleck | ............. | H05K 1/0256 439/67 |

* cited by examiner

*Primary Examiner* — Hung S Bui
(74) *Attorney, Agent, or Firm* — Brinks Gilson & Lione

(57) ABSTRACT

A voltage protection for printed circuit boards is provided, which is slotted on one end, such that it has printed circuit board strips, a mount, which is configured to at least partially receive the printed circuit board, and a voltage protection cover, which is configured to be connected to the mount and the printed circuit board, such that a chamber system is formed, in which each printed circuit board strip is disposed inside a chamber, which is formed by the connection between the mount and the voltage protection cover.

20 Claims, 2 Drawing Sheets

PROTECTIVE COVER FOR PRINTED CIRCUIT BOARD

RELATED APPLICATIONS

This application claims the priority of German Patent Application DE 10 2015 211 027.3, filed Jun. 16, 2015, which is incorporated by reference herein in their entirety.

BACKGROUND

1. Technical Field

The present invention relates to a voltage protection for printed circuit boards in accordance with the preamble of claim 1.

2. Background Information

In the automotive field, the development of transmissions and the control thereof is of primary importance. In order to protect the transmission control from undesired external effects, e.g. the impact of particles, in particular conductive particles, so-called voltage protection covers are used. These voltage protection covers should also be able to be used in regions of the vehicle that place high demands on materials and function, e.g. in the transmission fluid pan. The voltage protection cover is used to protect electrical contacts and other sensitive components against, e.g. shavings formed during production, and conductive particles, which could cause damage to the transmission control.

Known protective measures for transmission controls, which are used inside the transmission in particular, are designed to provide a fully sealed connection between the printed circuit board of the transmission control and the electrical conductors for establishing contact to the exterior. In order to obtain this sealed connection, the interface is frequently grouted using an adhesive. This method, on one hand, is expensive. On the other hand, a grouting is accompanied with the risk that it may become detached from adjacent components, and thus the transmission fluid may penetrate into the transmission control, i.e. the sealed connection may release. The transmission fluid is no longer able to flow out of the transmission control, and potentially present conductive deposits flushed away. Such deposits could then cause a short circuit, and damage or destroy the transmission control.

In order to solve this problem, protective elements have been developed, which need not be entirely sealed, i.e. small quantities of the fluid can penetrate into them. With this design, the fluid cannot form a conductive deposit between one contact and another contact. A protective element of this type provides, for example, a pre-safeguarding of the components, wherein the voltage protection cover is closed after the pre-safeguarding, and subsequently a final safeguarding of the components, e.g. the sensors, is obtained. The disadvantage with this is that the voltage protection cover must be sized generously, making it expensive. In order to overcome this disadvantage, it is proposed that a voltage protection element be provided which can still be moved, together with the assembly, after the preliminary securing. By this means, a smaller installation space may be implemented.

The disadvantage with all of these designs is also that no less expensive and more compact voltage protection is provided. Also, the voltage protection covers and systems known so far are not configured for printed circuit boards, but rather, for sensors or other assemblies, for example.

BRIEF SUMMARY

For this reason, the object of this invention is to provide a voltage protection for printed circuit boards, with which no conductive deposits are formed between individual contact points on the printed circuit boards that would cause a short circuit when fluid comes in contact with the printed circuit board. This object is achieved according to the invention by the features of claim 1. Advantageous designs are the subject matter of the dependent Claims.

In accordance with the invention, a voltage protection for printed circuit boards is proposed, comprising a printed circuit board, which is slotted on one end, such that it has printed circuit board strips, a mount, which is designed to receive the printed circuit board, at least in part, and a voltage protection cover, which is designed to be connected to the mount and the printed circuit board, such that a chamber system is formed, in which each printed circuit board strip is disposed inside a chamber, which is formed by the connection between the mount and the voltage protection cover.

As a result of the proposed geometry and arrangement of the components that form the voltage protection, fluid surrounding the voltage protection, or the transmission control device, onto which the voltage protection is preferably applied, can penetrate into the housing of the voltage protection, but it can also drain out of it. Thus, a fully sealed housing is not necessary, and the printed circuit board can thus also be only partially received in the voltage protection. Furthermore, as a result of the chamber system that is formed, the triggering of a short circuit between the printed circuit board strips by particles, particularly conductive particles, is prevented. As a result of the simple geometry, a compact housing can be provided to protect the printed circuit board, having a good protection against short circuits, and enabling a cleaning with fluid, but also allows the draining of the fluid, such that no deposits accumulate.

The printed circuit board can be attached to the mount via different methods, such as caulking or ultrasound welding, or other known methods.

The voltage protection cover can be attached by a variety of means, depending on the respective application and type of installation. By way of example, the voltage protection cover can be fastened to the mount by inserting additional catch elements in order to retain it in place, or by screws, welding, preferably laser welding, adhesive, snaps, or other fastening possibilities. The voltage protection cover can also be connected in a folding manner to the mount on one or more surfaces thereof, thus not being designed as an extra component, but rather as a part of the mount.

In one embodiment, the voltage protection cover has separating strips, and the mount has slots, which are arranged, in each case, such that after the mount is connected to the voltage protection cover, the separating strips are disposed in the slots, and thus form the chamber system.

The separating strips on the voltage protection cover and the corresponding slots in the mount simplify the installation of the voltage protection cover on the mount, on one hand, and form the desired chamber system, on the other hand. As a result, no additional method for fastening the separating strips to the mount is necessary, because the separating strips passing through the slots already form the chambers. Furthermore, an absolutely sealed housing is not necessary with this geometry, because any entering fluid can be used to rinse the chamber interiors, such that potentially existing particles are flushed out of the chamber together with the fluid that is being drained. Thereby, as a result of the separation of the individual printed circuit board strips from one another by the separating strips, a conductive connection cannot be formed between the electrical contacts located on the printed circuit board strips, and thus, short circuits can be prevented.

In order to avoid short circuits between the separating walls and the electrical contacts, which may result from particles or deposits extending from the separating walls to the printed circuit board strips, the separating walls are preferably made of an electrically insulating material, such as a plastic.

In another embodiment, the mount has a wire guide, which is designed and configured such that the wires can be guided by the wire guide from the exterior into the voltage protection, in order to establish contact with the associated printed circuit board strips.

The wire guide can have different geometries, depending on the type of application. By way of example, the wire guide can be round or polygonal; it can also be a slot or type of hole, however, through which a wire can be inserted. It is important thereby to ensure that the hole has the appropriate shape for the respective wire, and the hole is as small as possible, such that there is very little empty space between the inserted wire and the mount.

The wire guide ensures, on one hand, a simple positioning of the printed circuit board on the mount, because preferably each wire guide must be positioned on or above an associated printed circuit board strip, in order to form an electrically conductive contact. On the other hand, the wire guide also provides a certain sealing of the chamber against the exterior, as a part of the housing for the voltage protection, in order to limit an ingress of particles.

The wires can be fastened onto the printed circuit board strips by means of known methods, e.g. by means of soldering methods, such as hot bar soldering, etc. or other methods as well. The important thing is that an electrical contact between the wire and the printed circuit board strip is created.

In another embodiment, the voltage protection also has a base mount, onto which the mount, together with the printed circuit board, is attached. By providing a base mount, the mount, together with the printed circuit board, can also be protected at the bottom against particles and fluids. The base mount is attached to the mount. The attachment can be obtained through different methods known to the person skilled in the art. It is not absolutely necessary to provide a base mount in order to achieve the object of the invention, because a chamber system is already provided by the combination of the printed circuit board, the mount, and the voltage cover, which prevents a short circuit between adjacent printed circuit board strips through particles or deposits.

In another embodiment, the printed circuit board has at least one positioning aid for positioning the printed circuit board on the mount. The positioning aid may be a groove formed in the printed circuit board, e.g. through milling or some other material-removal method. A hole or a latching element attached to the printed circuit board can also be used, however, as the positioning aid. The only important thing thereby is that the positioning aid is formed such that the printed circuit board can be placed in the intended position on the mount. Furthermore, the mount may also have a counterpart to the positioning aid disposed on the printed circuit board, or alternatively, it, instead of the printed circuit board, may have a positioning aid. The printed circuit board can then have a corresponding counterpart.

Furthermore, according to the invention, a transmission control device having at least one voltage protection for printed circuit boards disposed thereon is created.

In all of the embodiments, the voltage protection can have a different number of printed circuit board strips, wires, and wire guides. The number is a function of the respective application, wherein the principle of the formation of chambers can be used for any number of printed circuit board strips, wires, and wire guides.

Further features and advantages of the invention can be derived from the following description of exemplary embodiments of the invention, based on the figures in the drawings, which show details according to the invention, and from the Claims. The individual features may be realized in and of themselves or in numerous arbitrary combinations, in a variation of the invention.

BRIEF DESCRIPTION OF THE DRAWINGS

Preferred embodiments of the invention shall be explained in greater detail below based on the attached drawings. Therein.

DETAILED DESCRIPTION OF THE DRAWINGS AND THE PRESENTLY PREFERRED EMBODIMENTS

In the following description of the figures, identical elements or functions are provided with the same reference symbols.

Figure 1A:
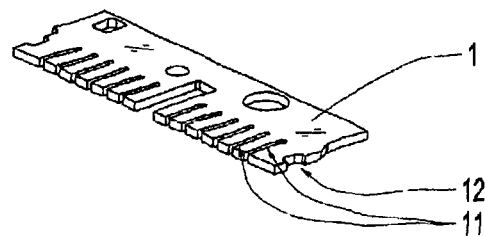
FIGS. 1a to 1c show the construction of a voltage protection according to one embodiment of the present invention.

FIG. 1a shows a printed circuit board 1 according to the invention, which is slotted, and thus has printed circuit board strips 11, via which an electrical contact with wires is obtained. Furthermore, FIG. 1a shows an exemplary positioning aid 12 in the form of groove on both sides of the printed circuit board 1.

Figure 1B:
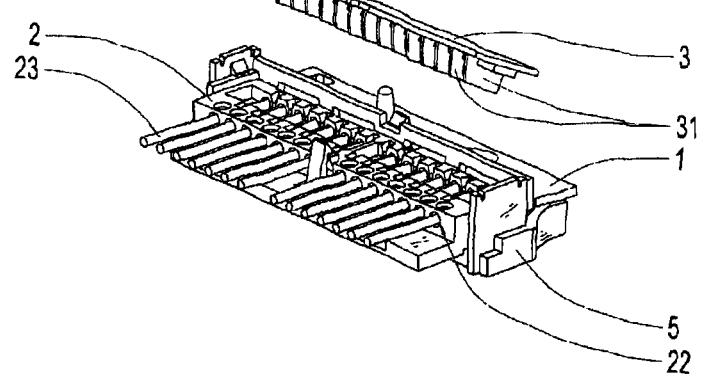

FIG. 1b shows an already partially installed voltage protection 100. The printed circuit board 1 is already attached to the mount 2 here. Wires 23 are already attached through the wire guide 22, which are already electrically connected to the respective printed circuit board strips 11 in the interior of the already nearly complete housing. In addition, a base mount 5 is shown in FIG. 1b, which protects the voltage protection against particles from below. Furthermore, a voltage protection cover 3 with separating strips 31 is shown, which must be placed on the mount 2, in order to form the chamber system according to the invention, having one chamber 4 for each combination of a printed circuit board strip 11 and a separating strip 31, which is shown more precisely in FIGS. 2a to 2c.

Figure 1C:
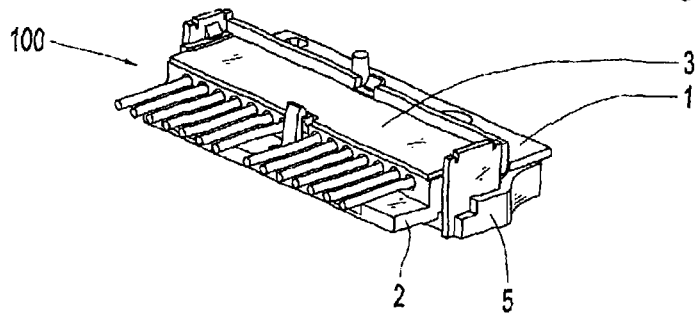

FIG. 1c shows the fully assembled voltage protection for printed circuit boards in accordance with the present invention. The voltage protection cover 3 is then attached to the mount 2, and forms, together therewith and the base body 5, a housing, which prevents a penetration of harmful particles. Fluid can penetrate into the individual chambers through the open geometry, and then be drained, by means of which deposits can be prevented, and the penetration of particles into the chambers can then be flushed out. By means of the chambers, it is prevented that a conductive connection between the individual printed circuit board strips is obtained, such that the open geometry, in contrast to other known housings, has no disadvantages, but rather, exhibits the advantage of the flushing.

Figure 2A:
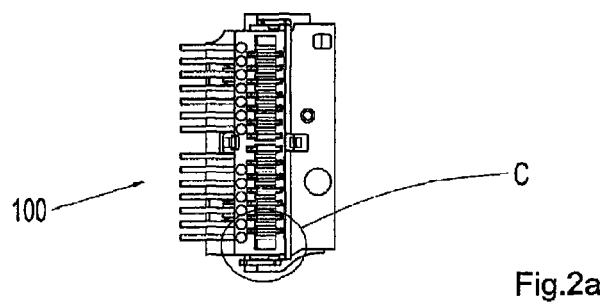
FIGS. 2a to 2c show a detail section of the voltage protection according to one embodiment of the present invention.

FIG. 2a shows a top view of a voltage protection 100 in accordance with an embodiment of the invention. The voltage protection cover 3 is installed here, but the cover is shown in a transparent manner, in order to enable a view from above that shows how the installation, or the positioning, respectively, of the printed circuit board 1 on the mount 2 is obtained. Details shall be shown and described in reference to FIGS. 2b and 2c, in which the detail section C shown in FIG. 2a is enlarged.

Figure 2B:
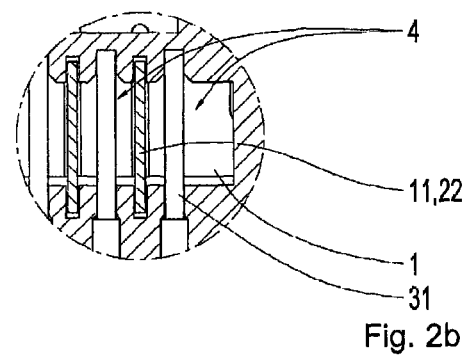

FIG. 2b shows a detail section C from FIG. 2a, in which the chambers 4 formed by the slots 21 of the mount 2 and the separating strips 31 of the voltage protection cover 3 inserted in the slots 21 are shown. In each case, a printed circuit board strip 21 and a wire 23 disposed thereon and electrically connected thereto are located in the chambers 4. The wire 23 is positioned precisely over the wire guide 22, or over the printed circuit board strip 21, respectively, such that no further adjustment is necessary.

Figure 2C:
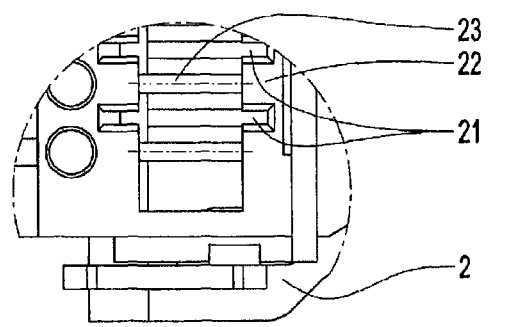

FIG. 2c likewise shows a detail section C from FIG. 2a, in which the geometry of the mount 2, particularly the slots 21 present on the mount 2 for inserting the separating strips 31 of the voltage protection cover 3, is shown. The slots 21 are disposed such that they separate the individual wire guides 22 and the printed circuit board strips 21 from one another, and thus form a chamber system, in which it is impossible for a short circuit to occur between individual printed circuit board strips 21 through deposits or particles.

A compact and inexpensive voltage protection for printed circuit boards is provided by the present invention, with which short circuits between two adjacent printed circuit board strips can be prevented in a simple and effective manner.

REFERENCE SYMBOLS 100 voltage protection
1 printed circuit board
11 printed circuit board strips
12 positioning aid
2 mount
21 slots
22 wire guide
23 wire
3 voltage protection cover
31 separating strip
4 chamber
5 base mount
C detail section

What is claimed is:

1. A voltage protection for printed circuit boards comprising:
   a printed circuit board slotted at one end, forming a plurality of printed circuit board strips;
   a mount configured to at least partially receive the printed circuit board; and
   a voltage protection cover comprising a plurality of separating strips, the voltage protection cover configured to be connected to the mount and the printed circuit board, such that a chamber system is formed by the connection between the mount and the voltage protection cover, the chamber system including a plurality of chambers, each chamber of the plurality of chambers formed between each printed circuit board strip of the plurality of printed circuit board strips and a respective separating strip of the plurality of separating strips.

2. The voltage protection for printed circuit boards of claim 1, wherein the mount comprises a plurality of slots, such that, after connecting the mount to the voltage protection cover, each separating strip of the plurality of separating strips is disposed in a respective slot of the plurality of slots forming the chamber system.

3. The voltage protection for printed circuit boards of claim 2, wherein the mount and the plurality of separating strips are made of an electrically insulating material.

4. The voltage protection for printed circuit boards of claim 3, wherein the mount has a wire guide, which is formed and oriented such that a wire can be guided from the outside into the voltage protection through the wire guide, in order to form a contact between the wire and an associated printed circuit board strip of the plurality of associated printed circuit board strips.

5. The voltage protection for printed circuit boards of claim 3, wherein the voltage protection also has a base mount, onto which the mount, together with the printed circuit board, is attached.

6. The voltage protection for printed circuit boards of claim 3, wherein the printed circuit board has at least one positioning aid for positioning the printed circuit board on the mount.

7. The voltage protection for printed circuit boards of claim 3, wherein the mount has at least one positioning aid for positioning the printed circuit board on the mount.

8. The voltage protection for printed circuit boards of claim 2, wherein the mount has a wire guide, which is formed and oriented such that a wire can be guided from the outside into the voltage protection through the wire guide, in order to form a contact between the wire and an associated printed circuit board strip of the plurality of printed circuit board strips.

9. The voltage protection for printed circuit boards of claim 2, wherein the voltage protection also has a base mount, onto which the mount, together with the printed circuit board, is attached.

10. The voltage protection for printed circuit boards of claim 2, wherein the printed circuit board has at least one positioning aid for positioning the printed circuit board on the mount.

11. The voltage protection for printed circuit boards of claim 2, wherein the mount has at least one positioning aid for positioning the printed circuit board on the mount.

12. The voltage protection for printed circuit boards of claim 1, wherein the mount has a wire guide, which is formed and oriented such that a wire can be guided from the outside into the voltage protection through the wire guide, in order to form a contact between the wire and an associated printed circuit board strip of the plurality of printed circuit board strips.

13. The voltage protection for printed circuit boards of claim 12, wherein the voltage protection also has a base mount, onto which the mount, together with the printed circuit board, is attached.

14. The voltage protection for printed circuit boards of claim 12, wherein the printed circuit board has at least one positioning aid for positioning the printed circuit board on the mount.

15. The voltage protection for printed circuit boards of claim 12, wherein the mount has at least one positioning aid for positioning the printed circuit board on the mount.

16. The voltage protection for printed circuit boards of claim 1, wherein the voltage protection also has a base mount, onto which the mount, together with the printed circuit board, is attached.

17. The voltage protection for printed circuit boards of claim 16, wherein the printed circuit board has at least one positioning aid for positioning the printed circuit board on the mount.

18. The voltage protection for printed circuit boards of claim 1, wherein the printed circuit board has at least one positioning aid for positioning the printed circuit board on the mount.

19. The voltage protection for printed circuit boards of claim 1, wherein the mount has at least one positioning aid for positioning the printed circuit board on the mount.

20. A transmission control device comprising:
at least one voltage protection for printed circuit boards, the at least one voltage protection comprising:
a printed circuit board slotted at one end, forming a plurality of printed circuit board strips;
a mount configured to at least partially receive the printed circuit board; and
a voltage protection cover comprising a plurality of separating strips, the voltage protection cover configured to be connected to the mount and the printed circuit board, such that a chamber system is formed by the connection between the mount and the voltage protection cover, the chamber system including a plurality of chambers, each chamber of the plurality of chambers formed between each printed circuit board strip of the plurality of printed circuit board strips and a respective separating strip of the plurality of separating strips.

* * * * *